United States Patent [19]

Matrick

[11] Patent Number: 4,565,773

[45] Date of Patent: Jan. 21, 1986

[54] DRY NONELECTROSCOPIC TONERS SURFACE COATED WITH NONIONIC SILOXANE-OXYALKYLENE BLOCK COPOLYMER

[75] Inventor: Howard Matrick, Highlands, N.J.

[73] Assignee: E. I. Du Pont de Nemours and Company, Wilmington, Del.

[21] Appl. No.: 554,330

[22] Filed: Nov. 22, 1983

[51] Int. Cl.[4] ................................................ G03C 5/04
[52] U.S. Cl. .................................... 430/331; 430/110; 430/291; 430/965
[58] Field of Search ............... 430/105, 108, 331, 110, 430/291, 965

[56] References Cited

U.S. PATENT DOCUMENTS 3,974,078  8/1976  Crystal ................................ 430/109

*Primary Examiner*—John L. Goodrow

[57] ABSTRACT

Dry nonelectroscopic toners comprising pigmented organic resin particles having a size distribution of 0.2 to 30 micrometers, not more than 50 percent of the particles being less than 1 micrometer, surface coated with nonionic siloxane polyoxyalkylene copolymer with a polar end as defined having a hydrophilic lipophilic balance in the range of 7 to 15. The toners are useful in color developing positive- and negative-working photosensitive elements, particularly in automatic toning machine. Good clean-up and low stain propensity are achieved.

8 Claims, No Drawings

DRY NONELECTROSCOPIC TONERS SURFACE COATED WITH NONIONIC SILOXANE-OXYALKYLENE BLOCK COPOLYMER

DESCRIPTION

TECHNICAL FIELD

This invention relates to dry nonelectroscopic toners. More particularly this invention relates to dry nonelectroscopic toners comprising pigmented organic resin particles surface coated with a nonionic siloxane polyoxyalkylene copolymer.

BACKGROUND ART

Reproduction processes are known wherein positive-working photopolymerizable elements and negative-working photosensitive elements are exposed imagewise through an original forming nontacky and tacky image areas. Positive-working photopolymerizable elements are described in Chu and Cohen U.S. Pat. No. 3,649,268 and negative-working photosensitive elements are described in Cohen and Fan U.S. Pat. Nos. 4,174,216 and 4,191,572. The image is developed by toning with a suitable toner which desirably adheres only in the tacky image areas. Excess toner which may be present is removed from the nontacky areas to provde, for example, an image which is a proof of the original or which can be used to transfer the image to another surface. Multilayer proofs such as surprint proofs can be made as well.

In view of the increasing importance of proof-making in the printing industry and the problems inherent therein, improved toners and applicators for applying these toners are desirable. Some recognized improvements in toners are those described in Chu and Manger U.S. Pat. No. 3,620,726, mixtures using these toners described in Gray U.S. Pat. No. 3,909,282 and the toners of Manger, Fickes and Long described in U.S. Pat. No. 4,215,193. From the early use of pads dipped in toners, improved toner applicators are the subject of Sandner U.S. Pat. No. 4,019,821 (hand operated toning) and Tobias U.S. Pat. No. 4,069,791 (automatic toning). Application of any of the above described toners as well as known prior art toners to tacky image areas of photosensitive elements has the problem that the background color resulting from the toners is difficult to completely remove from the nontacky areas of the said elements. Generally an attempt is made to remove the excess toner from the nontacky areas by means of mechanical action using a cloth, brush or other toner removal means. It is known that static is generated by rubbing dissimilar materials together. Depending on the particular film being toned and the toner removal means, the amount of static formed varies. For example, cleaning brushes closest to the film in the triboelectric table would be expected to generate a relatively low charge. Thus it would be expected that an acrylic brush would generate only a small charge with respect to an element that contains an acrylic compound in its photosensitive layer. The toner, however, can also generate a charge against the brush (or cleaning means) and the photosensitive element. If the toner, cleaning means and element have an identical place in the triboelectric table substantially no static charge would be generated. Such a system, while desirable, is not generally achieved. Despite the aforementioned disadvantage the removal of background color in the nontacky areas is desirable. In manual applications this is time consuming. Cleaning operation in a machine increases the cost thereof. After clean-up, some undesirable stain is usually present in the nontacky areas. The term "background color" as used herein is the color present in the nontacky background areas of an exposed and toned positive-working or negative-working photosensitive element prior to any step being taken to remove toner therefrom. Background color is the sum of two components: "stain" which as used herein is the color which is normally not capable of being removed from the background color areas by exhaustive wiping of the areas, and "clean-up" which as used herein is the color which is normally capable of being removed from the background color areas, e.g., by wiping, air impingement, etc.

Dry nonelectroscopic toners comprising pigmented organic resin particles have been developed which provide good clean-up and are substantially nonstaining in the nontacky areas of the photosensitive elements used to prepare multilayer proofs. Such toners have been surface treated with at least 0.5% by weight of a slip agent, i.e., silicone oil having a weight average molecular weight of about 230 to 50,000; saturated hydrocarbons having a weight average molecular weight of about 200 to 10,000; or fluorocarbon compounds having a weight average molecular weight of about 500 to 500,000, in combination with at least 1% by weight of an antistatic agent. The dry nonelectroscopic toner particles are described in Fickes U.S. Pat. No. 4,397,941. The surface coating of toners with two successive liquids complicates manufacture, testing and analysis of the toners.

It is desired to provide dry, nonelectroscopic toner particles which require only a single surface coating. Furthermore, it is desired to provide single surface coated toners which have clean-up qualities and non-staining of the nontacky areas of photosensitive elements of quality comparable or better than are provided by the known dry nonelectroscopic toner particles.

DISCLOSURE OF THE INVENTION

In accordance with this invention there is provided a dry nonelectroscopic toner comprising pigmented organic resin particles having a size distribution within the range of 0.2 to 30 micrometers and not more than 50 percent of the particles being less than one micrometer particle size, the improvement whereby the pigmented particles are surface coated with at least one nonionic compound which is liquid above 10° C., present as a single phase, and having a viscosity of less than 1000 cps and a hydrophile-lipophile balance in the range of 7 to 15 taken from the group consisting of:

(A) A mixture of block copolymers wherein each copolymer contains a siloxane polymer and at least one oxyalkylene polymer in combination, the siloxane polymer being composed of at least one trifunctional silicon atom, bonded to three oxygen atoms and a single monovalent hydrocarbon radical, and joined to at least three difunctional silicon atoms through oxysilicon bonds, each of said difunctional silicon atoms having two monovalent hydrocarbon radicals bonded thereto and the oxyalkylene polymer being composed of at least two oxyalkylene groups bonded to each other by oxycarbon bonds and bonded at one end to the siloxane polymer through a carbon-oxy silicon bond and bonded at the other end to a monoether radical, and (B) a block copolymer composed of (1) at least one siloxane unit represened by the formula:

$$R_bSiO_{4-b/2}$$

wherein R contains from one to about twenty-two carbon atoms inclusive and is selected from the class consisting of monovalent hydrocarbon groups and divalent hydrocarbon groups and b has a value from 1 to 3 inclusive, said siloxane block containing at least one of said siloxane units wherein at least one R group is a divalent hydrocarbon group, and (2) at least one oxyalkylene block containing at least two oxyalkylene groups represented by the formula: —R'O—, wherein R' is an alkylene group containing from two to about ten carbon atoms inclusive, said siloxane and oxyalkylene blocks being interconnected by said divalent hydrocarbon group.

The improved dry toners of this invention are nonelectroscopic toners comprising pigmented organic resin particles having a size distribution within the range disclosed above. Nonelectroscopic means that the toners are neither repelled from nor attracted to a charged rod when placed in close proximity to the particles. The lower propensity of the toners to stain nontacky areas and the ease with which the toners can be removed from such areas is largely attributed to the surface of the toner particles being coated with the nonionic liquid defined above having a hydrophile-lipophile balance (HLB) in the range of 7 to 15. Useful liquids are more fully described below.

The pigmented organic resin particles are described in Chu and Manger U.S. Pat. No. 3,620,726. Resin matrices include, e.g., polyvinyl chloride, cellulose acetate, cellulose acetate butyrate, polystyrene, polymethyl methacrylate. Also useful are water soluble polymer matrices, e.g., polyvinyl alcohol, methyl cellulose, carboxymethyl cellulose, the particular matrix being used depending on the mechanical means of processing the toner down to the desired effective particle size distribution. For the purpose of determining whether such a particle has the preferred particle size distribution these particles can be measured, for example, by a Coulter Counter, Coulter Electronics, Inc., Hialeah, Fla. The term "particle size" as used herein with respect to the toners covers the size distribution of the smallest, independently acting unit which is called upon to discriminate between the exposed and unexposed areas of the imaging element. The pigmented portion of the toners include: Monastral ® Blue G (C.I. Pigment Blue 15 C.I. No. 74160), Toluidine Red Y (C.I. Pigment Red 3)-process aggregated crystals, Quindo Magenta (Pigment Red 122), Indo Brilliant Scarlet Toner (Pigment Red 123, C.I. No. 71145), Toluidine Red B (C.I. Pigment Red 3), Watchung ® Red B (C.I. Pigment Red 48), Permanent Rubine F6B13-1731 (Pigment Red 184), Dalamar ® Yellow (Pigment Yellow 74, C.I. No. 11741). Toluidine Yellow G (C.I. Pigment Yellow 1), Monastral ® Blue B (C.I. Pigment Blue 15), Monastral ® Green B (C.I. Pigment Green 7), Pigment Scarlet (C.I. Pigment Red 60), Auric Brown (C.I. Pigment Brown 6), Monastral ® Green G (Pigment Green 7), Carbon Black, Stirling NS N 774 (Pigment Black 7, C.I. No. 77266), etc.

Useful nonionic liquids surface coated on the pigmented organic resin particles are of the siloxane polyoxyalkylene types described above. These polymers have polar substituents. Compounds type (A) above are disclosed in Bailey and O'Connor U.S. Pat. No. 2,834,748 and compounds type (B) above are disclosed in Huntington U.S. Pat. No. 3,305,504, the disclosures of which are incorporated by reference. Compounds type (A) are preferred and the siloxane polymer comprises from 5% to 95% by weight of the block copolymer. Generally the siloxane has a weight average molecular weight from about 500 to 10,000, and the oxyalkylene polymer has a weight average molecular weight from about 500 to 6,000. The mixture of block copolymers wherein each copolymer contains a siloxane polymer and at least one oxyalkylene polymer in combination has the general formula:

$$(R')(SiO_3)_x(R_2SiO)_y[(C_nH_{2n}O)_zR'']_a[R''']_{3x-a}$$

wherein R' is a hydrocarbon radical having a valence of x, R and R'' are monovalent hydrocarbon radicals, R''' is a member of the group consisting of alkyl radicals and $R_2Si$-radicals, x is an integer having a value of at least 1 y is an integer having a value of at least 3, n is an integer having a value of 2 to 4, a is an integer having a value of at least one and not greater than 3x and Z is an integer having a value of at least 2. Preferred nonionic siloxane polyoxyalkylene copolymers are a mixture of block copolymers wherein each copolymer contains a siloxane polymer and three oxyalkylene polymers in combinations and have the general formula:

$$R'Si \begin{matrix} O(R_2SiO)_p(C_nH_{2n}O)_zR'' \\ O(R_2SiO)_q(C_nH_{2n}O)_zR'' \\ O(R_2SiO)_r(C_nH_{2n}O)_zR'' \end{matrix}$$

wherein R, R' and R'' are monovalent hydrocarbon radicals, p, q, and r are integers each having a value of at least 1, n is an integer having a value of 2 to 4, and Z is an integer having a value of at least 2.

Particularly preferred compounds of type (A) are of the formula:

$$R'-Si[(O-\underset{\underset{CH_3}{|}}{\overset{\overset{CH_3}{|}}{Si}})_x(OC_2H_4)_a(OC_3H_6)_bOR']_3$$

wherein R' is alkyl radicals of 1 to 4 carbon atoms, x is 4 to 60, a+b=1 to x where a≧b.

Block copolymers of Type B are composed of (1) at least one siloxane unit represented by the formula:

$$R_bSiO_{4-b/2}$$

wherein R contains from one to about twenty-two carbon atoms inclusive and is selected from the class consisting of monovalent hydrocarbon groups and divalent hydrocarbon groups and b has a value from 1 to 3 inclusive, said siloxane block containing at least one of said siloxane units wherein at least one R group is a divalent hydrocarbon group, and (2) at least one oxyalkylene block containing at least two oxyalkylene groups represented by the formula: —R'O—, wherein R' is an alkylene group containing from two to about ten carbon atoms inclusive, said siloxane and oxyalkylene blocks being interconnected by said divalent hydrocarbon group.

Particularly preferred compounds of type (B) are of the formula:

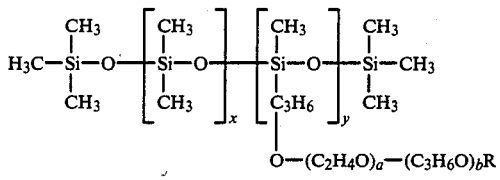

wherein R is hydrogen or alkyl radical of 1 to 4 carbon atoms, a is 1 to 30, b is 0 to 30, x+y=4 to 60 where x≧y and y≧1.

Suitable nonionic compounds described above have a hydrophile-lipophile balance (HLB) in the range of 7 to 15, preferably about 9 to 13 and more preferably about 9 to 11. HLB as used herein is the expression of the Hydrophile-Lipophile Balance, i.e., the balance of the size and strength of the hydrophilic (water-loving or polar) and the lipophilic (oil-loving or nonpolar) groups of a given compound that combines both hydrophilic and lipophilic groups. The HLB system was introduced by ICI Americas, Inc., Wilmington, DE 19897 and is more fully described in "The HLB System, A Time-saving Guide to Emulsifier Selection" edited and reprinted from CHEMMUNIQUE publication of ICI Americas, Inc., Wilmington, DE 19897. HLB values can be measured by a method described by W. C. Griffin, J. Soc. Cosmet. Chem. 1, 311–326 (1949).

The amount of nonionic liquid present on the surface of the pigmented organic resin particles is in the range of from about 5 to 21% by weight and more, preferably in the range from about 10 to 18% by weight and more preferably 15 to 18% by weight, the percentage by weight being based on the total weight of resin particles. One or more nonionic compounds can be mixed together prior to the surface treatment as long as they form a single phase liquid.

The surface treated pigmented organic resin particles have been found particularly effective when applied to tacky image areas using a modified automatic toning apparatus (Tobias U.S. Pat. No. 4,069,791) as described in Example 1 below. U.S. Pat. No. 4,069,791 is incorporated herein by reference.

The toner particles can be readily made as illustrated in Example 1 below. The nonionic liquid described above is surface coated on the pigmented resin particles. This is generally accomplished in a Patterson-Kelley Twin Shell Blender manufactured by Patterson-Kelley Co., Division of Harsco Corp., East Stroudsburg, PA or a Red Devil #30, 5400 Paint Conditioner Model MKI-R, Red Devil, Inc., Union, N.J. Other comparable blending devices can be used. The blending is for at least 5 minutes up to 30 minutes or longer.

The static charge on the surface-treated toners of the invention can be determined by a test procedure as follows:

50 grams of prepared magenta toner (type described in Example 1) are placed in 8 oz. polypropylene jars and let stand overnight in a room with a relative humidity of 20%. Twelve ¼ inch (0.635 cm) stainless steel balls are then placed in each jar, and the toners are thoroughly mixed by hand shaking for 60 seconds. After shaking the lids are removed and the voltage is recorded by inserting Sweeney Static Meter No. 1127 (contains radioactive material) dated 2/74, B. K. Sweeney Manufacturing Co., Denver, Colo. The results achieved with the treated (coated) and untreated toners are set forth in Table 1 wherein the percentages are by weight.

TABLE 1

| Sample* | Additive | Amount (%) | Voltage |
|---|---|---|---|
| 1 | 1 | 17.5 | 0 |
| 2 | 2 | 17.5 | 0 |
| 3 | 3 | 17.5 | 0 |
| 4 | 4 | 17.5 | 0 |
| 6 | None | — | −4,000 |

*Numbers of coating liquids correspond to those set forth in Example 1.

The toners of this invention are useful for color development of a surface having imagewise tacky and nontacky areas wherein to the image-bearing surface is applied the nonelectroscopic toners described above, and the toner particles are distributed over the image surface whereby the toner particles become embedded solely in the tacky image areas. The remaining toner particles are physically removed, e.g., by wiping with a suitable cloth or clean-up section of a toning apparatus if one is used. The nontacky areas are left substantially free of the toner particles. The tacky surface is present in:

(a) a photopolymerizable layer (positive-working wherein the exposed areas become photohardened) (Chu and Cohen, U.S. Pat. No. 3,649,268);

(b) an imagewise exposed photosensitive layer comprising at least one thermoplastic binder and a photosensitive system, consisting essentially of I. at least one dihydropyridine compound of the formula

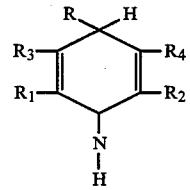

wherein
R is alkyl, alkenyl of 3 to 11 carbon atoms, phenylalkyl, phenylalkenyl, unsubstituted aryl of 6 to 10 carbon atoms, and heteroaryl,
$R_1$ and $R_2$, which can be the same or different, are alkyl, and
$R_3$ and $R_4$, which can be the same or different, are COOR', COR', CN, R' is alkyl; and II. at least one hexaarylbiimidazole compound, (negative-working wherein the exposed areas are tacky) (Abele and Grossa U.S. Pat. No. 4,243,741;

(c) an imagewise exposed element containing nontonable image areas and tacky nonphotosensitive image areas (also negative-working element) (Cohen and Fan U.S. Pat. No. 4,174,216). These patents are incorporated by reference.

Other systems known to those skilled in the art can be used provided that tacky and nontacky image areas are formed thereby. The tacky and nontacky image areas in these systems can be formed either directly, e.g., by exposure to actinic radiation or by treatment with solutions, heat or other means to obtain tacky image areas.

The above toned elements can be used to form surprint multicolor proofs by laminating at least one other tonable photoimageable layer over the previously imagewise toned layer. Each tonable layer is exposed through a different color separation transparency, and the respective layer is colored or developed with toners in a spectral region corresponding to the color separation transparency used for exposure. In most cases four photoimaged toned elements are present in a surprint proof, the toned elements and separation transparencies corresponding respectively to yellow, magenta, cyan and black.

A particularly preferred process involves automatic color development of a surface having imagewise tacky and nontacky areas by dispensing and embedding dry particulate toners on the surface by means of an automatic toning apparatus having a dispenser for dispensing said toner above said surface, and an applicator for embedding said particulate toners in said surface, and means for moving the tacky surface past the dispenser and said applicator, the dispenser includes a hopper having an independently movable side wall, and means to oscillate the side wall laterally of the tacky surface, thereby to supply the particulate material to the surface at a uniform, controlled rate, the improvement wherein the new, dry, nonelectroscopic toners described above are automatically dispensed, embedded, and the excess removed (from the nontacky areas).

The toned elements particularly useful in conjunction with the automatic toning apparatus comprise:

1. A supported photopolymer layer having tacky and nontacky areas, solely the tacky image areas being toned with the toners of the invention, and
2. A photopolymer element comprising in order from top to bottom a layer comprising a nontacky photohardenable material with ethylenically unsaturated or benzophenone type groups, a contiguous layer of a nonphotosensitive tacky organic material toned imagewise with the toners of the invention, and a support.

A preferred mode for carrying out the invention is illustrated in Example 1, Coating Liquid 3, Table 2.

INDUSTRIAL APPLICABILITY

The dry nonelectroscopic toners are useful for application to positive- or negative-working tacky photosensitive surfaces which are used to prepare color proofs, e.g., overlays and surprints. The toners are particularly useful in the toning of such elements in conjunction with toning apparatus, e.g., an automatic toning apparatus described in Tobias U.S. Pat. No. 4,069,791, without the need for a clean-up section. The toners are easily prepared requiring only one surface coating which permits shorter blending time when compared with two surface coatings. The toned photosensitive elements, whether positive- or negative-working, exhibit good toning and are substantially stain free in the nontacky areas. The clean-up of excess toner is advantageous since it is more easily accomplished.

EXAMPLES

The following examples illustrate the invention wherein the percentages are by weight. The polymeric molecular weights are weight average molecular weights which can be determined by using a light scattering technique using known standard samples, e.g., polystyrene, polymethacrylic acid, polymethylmethacrylate, etc., as known to those skilled in the art. The coating liquids used in Table 1 above and in the examples below are designaed by numbers as follows:

| Coating Liquid[a] | Physical Properties | | | |
|---|---|---|---|---|
| | Viscosity at 25° C. cSt | Melting Point (°C.) | Specific Gravity (25/25° C.) | Flash Point[b] (°F.) |
| 1. Silwet ® L-7500 copolymer | 175 | −43 | 0.99 | 150 |
| 2. Silwet ® L-7602 copolymer | 100 | −16 | 1.03 | 235 |
| 3. Silwet ® L-722 copolymer | 125 | −48 | 0.99 | 255 |
| 4. Silwet ® L-77 copolymer | 20 | 0 | 1.01 | 240 |

[a]"Silwet" is a registered trademark of Union Carbide, Danbury Ct.
[b]Pensky-Martens closed cup, ASTM Method 093

5. Silicone oil/R (OCH$_2$CH$_2$)$_n$—OH wherein R is an alkyl chain derived from about 50% lauryl (C$_{12}$) and cetyl (C$_{16}$). The silicone oil is dimethylpolysiloxane (200 Fluid CS, Dow Corning Co., Midland Glass, MI having a viscosity of 100 cps. Toners with this combination of liquids are described in Fickes U.S. Pat. No. 4,397,971. 6. Non liquid (control). 7. Silicone oil described in 5 above. 8. Quaternary ammonium compound of the formula:

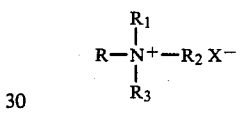

wherein R is a mixture of cetyl (27%), stearyl (30%) and oleoyl (42%) alkyl chains, R$_1$ is methyl, R$_2$ and R$_3$ are polyether substituents of the formula: —(CH$_2$CH$_2$O)$_m$—[CH$_2$CH(CH$_3$)O]$_n$—H wherein m is 1 and n is 3, and X is an anion CH$_3$SO$_4^-$. 9. Combination of compound 7 and compound 8.

L*a*B* values set forth in the examples below are calculated using the equations set forth on page 63 under the discussion of 1976 CIE L*a*b* (CIELAB system) in F. W. Billmeyer, and M. Saltzman "Principles of Color Technology," 2nd Edition 1981, pages 62 and 63. After subtracting the L*a*b* values for the area under the stain patch from the L*a*b* values for the unprotected nonreceptive or background areas of the toned photosensitive elements, ΔE is calculated using the following equation:

$$\Delta E = \sqrt{(\Delta L^*)^2 + (\Delta a^*)^2 + (\Delta b^*)^2}$$

EXAMPLE 1

The following ingredients were used in the preparation of a magenta toner:

| Ingredient | Amount (g) |
|---|---|
| Quindo Magenta (Pigment Red 122, Allied Chemical Corp., Harmon Colors) | 12,780 |
| Indo Brilliant Scarlet Toner (Pigment Red 123, C.I. No. 71145) | 2,650 |
| Cellulose acetate | 26,870 |
| Acetone | 97,547 |
| Water | 79,397 |

The water and acetone were thoroughly mixed and were charged to a Type 30-S Attritor stirred and jacketed ball mill (Union Process Co., Akron, Ohio). This mill contained ⅛ inch (0.49 cm) Type 440 stainless steel balls that were agitated at 150 rpm. A nitrogen atmosphere was maintained in the mill during the mixing procedure. Approximately two-thirds of the weight of the cellulose acetate was then added during a 3 to 5 minute period and was agitated in the liquid for about 2 minutes. The pigment was then added over a 2 minute period followed by the remainder of the cellulose acetate. The mixture was then agitated at about 150 rpm in the mill for about 6 hours at 22° C.; 5 gallons of water were added in 2 minutes followed by agitation for 5 minutes. The mill was drained and washed with water and the combined effluents were filtered to collect the wet toner. The wet toner was water-washed and dried in an oven at 115°–125° C., and the dried toner was pulverized in a pin mill. The particle size distribution of the toner at this point was 0.2 to 30 micrometers with not more than 50% of the particles less than 1 micron equivalent spherical diameter.

200 grams of an untreated magenta toner, an appropriate amount of one or two liquid surface treatments as indicated in Table 2, and a 9 inch (22.86 cm) stainless steel chain were added to a two quart Bain Marie container (Le Beau Products, Baraboo, Wis. 53913), and after stirring with a spatula, the mixture was blended 30 minutes on a Red Devil Paint Conditioner; Model MIK-R (Red Devil, Inc., Union, NJ).

A positive-working photopolymerizable element similar to that described in Example 1, Chu and Cohen U.S. Pat. No. 3,649,268 was prepared having a 0.0003 inch (0.00076 cm) photopolymer layer coated on 0.0005 inch (0.0013 cm) polyethylene terephthalate film support, and covered by a suitable 0.00075 inch (0.0019 cm) polypropylene cover sheet. As described in Example 1 of said U.S. Pat. No. 3,649,268, the cover sheet was removed and the photopolymer layer was laminated to Kromekote ® paper (on cast coated side). A suitable solid test pattern image was exposed on the photopolymer whereby the exposed areas became hardened and the unexposed areas remained tacky. The polyethylene terephthalate film was then removed, a 1.25 inch (~3.18 cm) square self sticking label was attached to an exposed area of the imaged element, and the image was developed by toning using the toning apparatus described in Tobias U.S. Pat. No. 4,069,791 wherein the hopper has a laterally oscillating sidewall and the cleaning pad was eliminated. The machine was run at 4 ft/min (1.22 m/min). The label protected the exposed, nonreceptive area of the element under it from being contacted with toner particles during the toning step. To obtain equilibrium conditions rapidly the toning pad was first saturated with toner by applying toner on the pad across its width and pressing it with a 1 inch (2.54 cm) wide spatula. The stain patch was removed after toning the element and results indicated in Table 2 were obtained using the process described below.

A negative-working photosensitive element was prepared by laminating in surface-to-surface relationship at room temperature with a pressure of about 40 psi (2.81 kg/dm²) a supported photopolymerizable layer (I) and supported tonable, tacky elastomer contiguous layer (II). Layers I and II are prepared as follows:

I. Nontonable Photopolymerizable Layer

A coating solution of a photopolymerizable composition was prepared by mixing together the following ingredients:

| Ingredient | Weight (g) |
| --- | --- |
| Polymethyl methacrylate (M.W. 200,000–300,000) | 41.54 |
| Di-(3-acryloxy-2-hydroxypropyl) ether of Bisphenol-A | 51.86 |
| (2-Chlorophenyl-4,5-diphenyl imidazolyl)dimer | 2.20 |
| 2-(Stilbyl-4″)-(naptho-1′,2′;4.5)1,2,3-triazol-2″-sulfonic acid phenyl ester | 2.20 |
| 2-Mercaptobenzoxazole | 1.50 |
| Polyethylene oxide (M.W. 600,000) | 0.70 |
| Methanol | 20.70 |
| Methylene chloride | 323.70 |

This solution was coated at a coating weight of about 40 mg/dm² when dried on a clear polyethylene terephthalate film having a thickness of 0.0005 inch (0.0015 cm) which was surface treated by electrostatic discharge at 0.07 coulombs/ft² (0.093 coulombs/m²).

II. Tonable, Tacky Elastomer Contiguous Layer

A coating solution was prepared by mixing together the following ingredients:

| Ingredient | Weight (g) |
| --- | --- |
| Random copolymer of styrene/butadiene (40/60) | 19.75 |
| Cis-polybutadiene (Mooney Viscosity 55–60) | 79.75 |
| Tetra-bis-[methylene-3-(3′,5′-di-t-butyl-4′-hydroxyphenyl) propionate] methane | 0.50 |
| Methylene chloride to make | 1333.30 |

This solution was coated on polyethylene terephthalate film having a releasable layer of polydimethyl siloxane coated thereon to give a coating weight of about 125 mg/dm² when dried.

The negative-working element was exposed through the electrostatic discharge treated, clear polyethylene terephthalate film for about 30 seconds on a Berkey-Ascor Vacuum Printer exposure device, fitted with a photopolymer lamp (B 2 KW) and a Kokomo ® glass filter (No. 400) Kokomo Opalescent Glass Co., Kokomo, IN. The distance between the lamp and the vacuum frame of the device was about 38 inches (96.52 cm). After exposure, the exposed element was taped securely to a suitable flat surface, and the clear polyethylene terephthalate cover sheet was stripped by pulling at one corner with an even, continuous motion at an angle of about 135°–180°. The resulting exposed, photopolymerized image adhered to the treated polyethylene terephthalate film and was removed therewith exposing equivalent areas of the contiguous layer (II). The tacky image was developed by toning using the toning apparatus described above. A self sticking label was attached prior to toning, and removed after toning as described earlier. Results shown in Table 2 below were obtained as follows:

Total background color caused by a combination of poor "clean-up" and "stain" was measured. L* a* b* data was obtained on the area under the stain patch. This value was subtracted from the value obtained in the unprotected, nonreceptive or background areas of the toned element. Ten measurements were made on each toned element:

two within 1 inch (2.54 cm) of the leading edge of the toned element.

two in each third of the toned element for a total of six.

two within 1 inch (2.54 cm) of the trailing edge of the toned element. (This is important since it is often sensitive to poor clean-up.)

The data was reported as $\Delta E$, calculated as described above, the larger the value the greater the background color. Measurements were made using the ACS Spectrosensor, manufactured by Applied Color Systems, Princeton, NJ.

TABLE 2

| Coating Liquid | Amt. Added (%) | HLB Value | ($\Delta E$) in L*a*b* units | | | |
|---|---|---|---|---|---|---|
| | | | Negative Working Film | | Positive Working Film | |
| | | | Average | Trailing Edge | Average | Trailing Edge |
| 1. | 17.5 | 10 | 0.54 | 0.78 | 0.39 | 0.31 |
| 2. | 17.5 | 10.5 | 0.48 | 0.56 | 0.60 | 0.50 |
| 3. | 17.5 | 9 | 0.38 | 0.35 | 0.27 | 0.20 |
| 4. | 17.5 | 13 | 3.34 | 5.62 | 0.85 | 1.06 |
| 5. | 10/5 | — | 3.38 | 11.9 | 0.51 | 1.10 |
| 6. | — | — | 68.53 | 71.79 | 30.56 | 40.85 |

EXAMPLE 2

Magenta toners were prepared by the procedure described in Example 1. These toners were then surface coated with incremental amounts of the liquid listed in Table 3 below using the procedure described in Example 1.

Positive and negative working photosensitive elements were laminated, exposed and toned as described in Example 1 using the toners set forth in Table 3. Background color ratings were made prior to hand wiping the toned elements exiting the toning apparatus with a Lastik ® cloth, whereas "stain" measurements were made using the ACS Spectrosensor described in Example 1 after hand wiping. These results are shown in Table 3. The background color ratings of 1 through 5 are defined in Table 4.

TABLE 3

| Coating Liquid | Amt. Added (%) | Negative Working Element | | Positive Working Element | |
|---|---|---|---|---|---|
| | | Background[2] Color | Stain ($\Delta E$) | Background[2] Color | Stain ($\Delta E$) |
| 1 | 20.0 | 2 | 0.2 | — | — |
| 1 | 17.5 | 2 | 0.3 | 2 to 3 | 0.2 |
| 1 | 15.0 | 2+ to 3 | 0.2 | — | — |
| 1 | 12.5 | 4 | 0.1 | — | — |
| 5[1] | 16.8 | 3 | 0.2 | — | — |
| 7 | 8.9 | 5+ | 0.3 | — | — |
| 8 | 5.0 | 4 | 4.8 | 4 | 2.7 |
| 8 | 15.0 | 3+ | 2.5 | 3+ | 1.5 |
| 8 | 20.0 | 2+ | 2.1 | 3 | 0.8 |

[1]Toner was surface coated with Merpol ® SE (11.8%) Silicone oil (5.0%) using a Patterson-Kelley Twin Shell Blender manufactured by Patterson-Kelley Co., Division of Harsco Corp., East Stroudsburg, PA as described in Example 1 of U.S. Pat. No. 4,360,240.
[2]Rated by visual examination of proofs.

TABLE 4

| Rating | Background Color Definition |
|---|---|
| 1 | Light to medium mat of toner trailing edge of proof only. No visible toner rest of proof. |
| 1+ | Light to medium mat of toner trailing half of proof. No visible toner first half of proof. |
| 2 | Light mat of toner covering entire proof. |
| 3 | Medium mat of toner covering entire proof. |
| 4 | Thick mat of toner covering entire proof. |
| 5 | Very thick mat of toner covering entire proof. |

EXAMPLE 3

The following ingredients were used in the preparation of a magenta toner:

| Ingredient | Amount (g) |
|---|---|
| Permanent Rubine F6B 13-1731 (Pigment Red 184, American Hoechst) | 4,330.0 |
| Monastral ® Blue G (Copper Phthalocyanine, Pigment Blue 15 C.I. No. 74160) | 7.8 |
| Cellulose acetate | 5,870.0 |
| Acetone | 27,216.0 |
| Water | 22,680.0 |

The water and acetone were thoroughly mixed and were charged to a Type 30-S Attritor stirred and jacketed ball mill (Union Process Co., Akron, Ohio). This mill contained ⅛ inch (0.049 cm) Type 440 stainless steel balls that were agitated at 150 rpm. A nitrogen atmosphere was maintained in the mill during the mixing procedure. Approximately two-thirds of the weight of the cellulose acetate was then added during a 3 to 5 minute period and was agitated in the liquid for about 2 minutes. The pigment was then added over a 2 minute period followed by the remainder of the cellulose acetate. The mixture was then agitated at about 150 rpm in the mill for about 4 hours at 22° C.; 5 gallons of water were added in 2 minutes followed by agitation for 5 minutes. The mill was drained and washed with water; and the combined effluents were filtered to collect the wet toner. The toner was water-washed and dried in an oven at 115°–125° C., and the dried toner was pulverized in a pin mill. The particle size distribution of the toner at this point was 0.2 to 30 micrometers with not more than 50% of the particles less than 1 micron equivalent spherical diameter.

250 grams of an untreated magenta toner, an appropriate amount of one or two liquid surface treatments as indicated in Table 4, and a 9 inch (22.86 cm) stainless steel chain were added to a two quart Bain Marie container (Le Beau Products, Baraboo, Wis. 53913), and after stirring with a spatula, the mixture was blended 30 minutes on a Red Devil Paint Conditioner; Model MKI-R (Red Devil, Inc., Union, NJ).

A negative-working photosensitive element was prepared and exposed as described in Example 1. After exposure, the exposed element was taped securely to a suitable flat surface, and the clear polyethylene terephthalate cover sheet was stripped by pulling at one corner with an even, continuous motion at an angle of about 135° to 180°. The resulting exposed photopolymerized image adhered to the treated polyethylene terephthalate film and was removed therewith exposing equivalent areas of the contiguous layer (II). The tacky image was developed by toning using the toning apparatus described in Example 1. A self-sticking label was attached prior to toning, and removed after toning as described earlier. Results shown in Table 5 were obtained as follows:

Total background color caused by a combination of poor "clean-up" and stain was measured using the ratings set forth in Table 4 above. After wiping the proof with a Lastik ® cloth stain measurements were made with the data reported as ΔE determined as described above.

TABLE 5

| Coating Liquid | Amt. Added (%) | Background Color | | Stain (ΔE) |
| --- | --- | --- | --- | --- |
| | | Fresh[1] | Aged[1] 3 Days at 75° C. | |
| 1 | 17 | 1 | 1 | 0.3 |
| 5 | 11.8/5 | 2 | 4 | 0.7 |
| 9 | 9/7 | 1 | 2+ | 0.6 |

[1]Rated by visual examination of proofs as defined in Table 4.

EXAMPLE 4

A. The following ingredients were used to prepare a yellow toner:

| Ingredient | Amount (g) |
| --- | --- |
| Dalamar ® Yellow (Pigment Yellow 74, C.I. No. 11741) | 4,360.0 |
| Cellulose Acetate | 6,538.0 |
| Acetone | 27,669.6 |
| Water | 22,680.6 |

The toner was prepared as described in Example 1 except that the milling time was 4 hours. The toner was dried and pulverized as described in Example 1 and is designated Y1.

B. The following ingredients were used to prepare a cyan toner:

| Ingredient | Amount (g) |
| --- | --- |
| Monastral ® Blue G (Copper Phthalocyanine, Pigment Blue 15 C.I. No. 74160) | 1,728.0 |
| Cellulose Acetate | 7,871.0 |
| Acetone | 27,669.6 |
| Water | 22,680.6 |

The toner was prepared as described in Example 1 and is designated C1.

C. The following ingredients were used to prepare a black toner:

| Ingredient | Amount (g) |
| --- | --- |
| Carbon Black, Sterling NS N 774 (Pigment Black 7, C.I. No. 77266) | 6,300.0 |
| Cellulose Acetate | 6,300.0 |
| Acetone | 27,669.6 |
| Water | 22,680.6 |

The toner was prepared in the same manner as described in Example 1 and is designated B1.

200 grams of an untreated toner, an appropriate amount of one or two surface treatments as indicated in Table 6 below and a 9 inch (22.86 cm) stainless steel chain were added to a two quart Bain Marie Container (Le Beau Products, Baraboo, Wis. 53913), and after stirring with a spatula, the mixture was blended 30 minutes on a Red Devil Paint Conditioner, Model MK1-R (Red Devil, Inc., Union, NJ).

The amounts of coating liquid 3 used in treating toners Y1, C1, and B1 were picked to match the combined amount of components in coating liquid 5 needed for optimum clean-up performance in negative-working photosensitive elements.

Negative-working photosensitive elements, prepared as described in Example 1, were exposed, stripped, and toned as described in Example 1. Results are shown in Table 6 below. The background color ratings are as defined in Table 4.

TABLE 6

| Toner | Coating Liquid | Amount Added (%) | Background Color Rating |
| --- | --- | --- | --- |
| Y1 | 3 | 36.5 | 1 |
| Y1 | 5 | 8.5/28.0 | 1 |
| C1 | 3 | 26.0 | 1 |
| C1 | 5 | 10.0/16.0 | 1 |
| B1 | 3 | 24.0 | 1 |
| B1 | 5 | 4.0/20.0 | 1 |

EXAMPLE 5

A positive-working photopolymerizable element as described in Example 1, after removal of the cover sheet, is laminated at about 110° C. to the smooth side of Kromekote ® cast-coated one-sided paper, manufactured by Champion Paper and Fiber Company on a fixed-bed transfer machine as described in Chu, Cohen and Tobias U.S. Pat. No. 3,594,535, incorporated by reference. The photopolymer layer is exposed at a distance of about 27 inches (68.6 cm) through a minus-blue separation halftone positive for about 8 seconds using a nuArc ® Plate Maker "Flip Top", Model FT26M-2 carbon arc light source. The polyethylene terephthalate support is removed at room temperature and yellow toner, prepared as described in Example 4A surface coated with 36.5% coating liquid 3, is applied to the exposed photopolymer surface using the automatic toner apparatus described in Example 1, adapted for 4-toner application. The clean-up and toning quality are good and the stain-free quality is also good. The toner adheres only to those image areas that are not exposed to the radiation.

The cover sheet is removed from a second element as described in Example 1, and the clear photopolymer layer is laminated onto the yellow-toned layer, obtained above, at a temperature of 110° C. The two-layer element is exposed through a minus-green separation halftone positive for about 3 seconds using the nuArc ® light source. The base support is stripped from the photopolymer, and a magenta toner prepared as described in Example 1, surface coated with 17.5% coating liquid 3, is applied to the exposed photopolymer surface at room temperature using the automatic toning apparatus described above. The clean-up, toning quality and stain-free quality are good.

The cover sheet is removed from a third photopolymerizable element coated with the above-described composition and the clear photopolymer layer is laminated onto the magenta-toned layer, obtained above, at a temperature of 110° C. This is exposed through the minus-red halftone positive for about 3 seconds using the nuArc ® light source. The polyethylene terephthalate support is removed from the layer and a cyan toner, prepared as described in Example 4B surface coated with 26% coating liquid 3, is applied to the exposed photopolymer surface using the automatic toner apparatus described above. The clean-up, toning quality, and stain-free quality are good.

A fourth photopolymerizable layer is laminated onto the cyan-toned layer of the three-layer film base using the same procedure and under the same conditions used in preparing the two previous layers. The fourth layer is exposed through a black printer halftone positive for about 3 seconds using the nuArc ® light source. After stripping off the polyethylene terephthalate support, a black toner prepared as described in Example 4C surface coated with 24% coating liquid 3, is applied to the exposed photopolymer surface using the automatic toner apparatus described above. The clean-up, toning quality and stain-free quality are good.

After application of the black toner, a fifth layer of photopolymer is laminated at 110° C. over the four-color halftone positive which simulates closely a press proof.

I claim:

1. A dry nonelectroscopic toner consisting essentially of pigmented organic resin particles having a size distribution within the range of 0.2 to 30 micrometers and not more than 50 percent of the particles being less than one micrometer particle size, the improvement whereby the pigmented particles are surface coated with a nonionic black copolymer compound which is liquid above 10° C., present as a single phase, and having a viscosity of less than 1000 cps and a hydrophile-lipophile balance in the range of 7 to 15 taken from the group consisting of
(A) A mixture of block copolymers wherein each copolymer contains a siloxane polymer and at least one oxyalkylene polymer in combination, the siloxane polymer being composed of at least one trifunctional silicon atom, bonded to three oxygen atoms and a single monovalent hydrocarbon radical, and joined to at least three difunctional silicon atoms through oxysilicon bonds, each of said difunctional silicon atoms having two monovalent hydrocarbon radicals bonded thereto and the oxyalkylene polymer being composed of at least two oxyalkylene groups bonded to each other by oxycarbon bonds and bonded at one end to the siloxane polymer through a carbon-oxy-silicon bond and bonded at the other end to a monoether radical,
(B) a block copolymer composed of (1) at least one siloxane unit represented by the formula:

$R_bSiO_{4-b/2}$ 

wherein R contains from one to about twenty-two carbon atoms inclusive and is selected from the class consisting of monovalent hydrocarbon groups and divalent hydrocarbon groups and b has a value from 1 to 3 inclusive, said siloxane block containing at least one of said siloxane units wherrein at least one R group is a divalent hydrocarbon group, and (2) at least one oxyalkylene block containing at least two oxyalkylene groups represented by the formula: —R'O—, wherein R' is an alkylene group containing from two to about ten carbon atoms inclusive, said siloxane and oxyalkylene blocks being interconnected by said divalent hydrocarbon group, and
(C) mixtures of said block copolymers.

2. A toner according to claim 1 wherein the hydrophile-lipophile balance is in the range of about 9 to 13.

3. A toner according to claim 1 wherein nonionic compound (A) is a mixture of block copolymers wherein each copolymer contains a siloxane polymer and at least one oxyalkylene polymer in combination and has the general formula:

$(R')(SiO_3)_x(R_2SiO)_y[(C_nH_{2n}O)_zR'']_a[R''']_{3x-a}$ 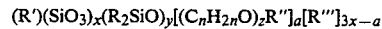

wherein R' is a hydrocarbon radical having a valence of x, R and R'' are monovalent hydrocarbon radicals, R''' is a member of the group consisting of alkyl radicals and $R_2Si$-radicals, x is an integer having a value of at least 1, y is an integer having a value of at least 3, n is an integer having a value of 2 to 4, a is an integer having a value of at least one and not greater than 3x and Z is an integer having a value of at least 2.

4. A toner according to claim 1 wherein nonionic compound (A) is a mixture of block copolymers wherein each copolymer contains a siloxane polymer and three oxyalkylene polymers in combination and have the general formula:

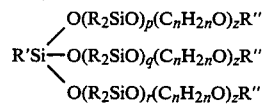

wherein R, R' and R'' are monovalent hydrocarbon radicals, p, q, and r are integers each having a value of at least 1, n is an integer having a value of 2 to 4, and Z is an integer having a value of at least 2.

5. A toner according to claim 1 wherein nonionic compound (A) is of the formula:

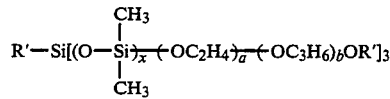

wherein R' is alkyl radical of 1 to 4 carbon atoms, x is 4 to 60, a+b=1 to x where a≧b.

6. A toner according to claim 1 wherein nonionic compound (B) is of the formula:

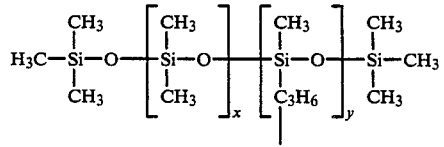

wherein R is hydrogen or alkyl radical of 1 to 4 carbon atoms, a is 1 to 30, b is 0 to 30, x+y=4 to 60 where x≧y and y≧1.

7. A toner according to claim 1 wherein the nonionic compound is present on the surface of the pigmented resin particles in the range of from about 5% to 21% by weight.

8. A toner according to claim 7 wherein the pigmented resin particles are comprised of cellulose acetate particles having pigment particles embedded in their surfaces.

* * * * *

UNITED STATES PATENT OFFICE
CERTIFICATE OF CORRECTION

PATENT NO. : 4,565,773
DATED : January 21, 1986
INVENTOR(S) : Howard Matrick

It is certified that error appears in the above-identified patent and that said Letters Patent are hereby corrected as shown below:

In Claim 1, Column 15, line 34:

"black" should be --block--.

Signed and Sealed this

Sixth Day of May 1986

[SEAL]

Attest:

Attesting Officer

DONALD J. QUIGG

Commissioner of Patents and Trademarks